United States Patent

Wu

[11] Patent Number: 6,165,850
[45] Date of Patent: Dec. 26, 2000

[54] METHOD OF MANUFACTURING MASK READ-ONLY-MEMORY

[75] Inventor: Jyh-Ren Wu, Taipei, Taiwan

[73] Assignee: Worldwide Semiconductor Manufacturing Corp., Hsinchu, Taiwan

[21] Appl. No.: 09/306,351

[22] Filed: May 6, 1999

[30] Foreign Application Priority Data

Apr. 3, 1999 [TW] Taiwan ................................ 88105359

[51] Int. Cl.⁷ ........................................... H01L 21/8246
[52] U.S. Cl. ......................................................... 438/275
[58] Field of Search ................................... 438/275–278

[56] References Cited

U.S. PATENT DOCUMENTS 5,480,823 1/1996 Hsu .
5,573,966 11/1996 Hsu .
5,652,162 7/1997 Liao .
5,920,778 7/1999 Rosner et al. ........................... 438/270
5,923,992 7/1999 Spikes et al. ........................... 438/424
5,998,278 12/1999 Yu ........................................... 438/424
6,040,231 3/2000 Wu ........................................... 438/424

*Primary Examiner*—Jey Tsai
*Attorney, Agent, or Firm*—J.C. Patents; Jiawei Huang

[57] ABSTRACT

A method of manufacturing mask read-only-memory. The method includes forming a plurality of first and second active regions in designated locations on a substrate. Each first and second active region has a channel region and a source/drain region on both side of the channel. Subsequently, shallow trench oxide are formed within the channel regions of the first active regions, and then source/drain terminals are formed in the respective source/drain regions of first and second active regions. Finally, a gate terminal is formed over the channel region.

5 Claims, 2 Drawing Sheets

METHOD OF MANUFACTURING MASK READ-ONLY-MEMORY

CROSS-REFERENCE TO RELATED APPLICATION

This application claims the priority benefit of Taiwan application serial no. 88105359, filed Apr. 3, 1999, the full disclosure of which is incorporated herein by reference.

BACKGROUND OF THE INVENTION

1. Field of Invention

The present invention relates to a method of manufacturing mask read-only-memory (ROM). More particularly, the present invention relates to a method of manufacturing mask ROM that utilizes shallow trench oxide to produce a non-conductive transistor channel.

2. Description of Related Art

Memory cells of a mask ROM are generally made using channel transistors. Programming of the ROM is achieved by selectively implanting ions into the channels of these transistors. By implanting ions into the channel regions of specified transistors, threshold voltage of the devices changes. Hence, the 'on' or 'off' state of the memory cell is coded. A mask ROM cell is formed by laying a polysilicon word line (WL) over a bit line (BL), and the memory cell channel is formed in the region underneath the word line between neighboring bit lines. Normally, each ROM cell is in a logic state of '1' or '0' depending on whether ions are implanted into the channel region or not. The advantage of being able to program the state of each ROM cell by an ion implant operation is that semi-finished ROM products can be made. Once the required program codes arrive, a mask can be made and then the final ion implant operation can be carried out, thereby shortening customers' delivery date. However, the method requires the production of one more photomask to carry out an ion implant operation. Moreover, reliability of the final ROM product is very much dependent upon the quality of the ion implant operation.

An alternative method is to decide which channels are to be conductive prior to the production of the channel transistors. If a particular channel in a memory cell is designed to be non-conductive, a field oxide (FOX) layer is formed in the channel region of the transistor. Since the programming pattern is already established prior to production, no additional photomask and ion implant operation is need. Hence, higher reliability can be attained. However, as the level of device integration continues to increase, the available space for accommodating a memory cell decreases correspondingly. Because the edge of a FOX layer includes a bird's beak structure, the ultimate level of integration is affected. Moreover, the upper surface of a FOX layer is higher than the level of the surrounding substrate surface after thermal oxidation. Consequently, the substrate has a lower degree of surface planarity.

SUMMARY OF THE INVENTION

In light of the foregoing, there is a need to provide an improved method of manufacturing mask ROM.

Accordingly, the present invention provides a method of manufacturing mask ROM that utilizes the formation of shallow trench oxide to form a non-conductive channel.

To achieve these and other advantages and in accordance with the purpose of the invention, as embodied and broadly described herein, the invention provides a method of manufacturing mask ROM. The method includes forming a plurality of first and second active regions in designated locations on a substrate. Each first and second active region has a channel region and a source/drain region on both side of the channel. Subsequently, shallow trench oxide are formed within the channel regions of the first active regions, and then source/drain terminals are formed in the respective source/drain regions of first and second active regions. Finally, a gate terminal is formed over the channel region.

According to this invention, the method has the capacity to increase the level of integration for mask ROM as well as the degree of surface planarity of the substrate. Since field oxide (FOX) layers are replaced by shallow trench oxide, bird's beak structure can be avoided and hence desired dimensions can be better controlled. Moreover, unlike a FOX layer, the shallow trench oxide has a higher degree of planarity. Therefore, a higher degree of planarity for the substrate is obtained by the invention.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
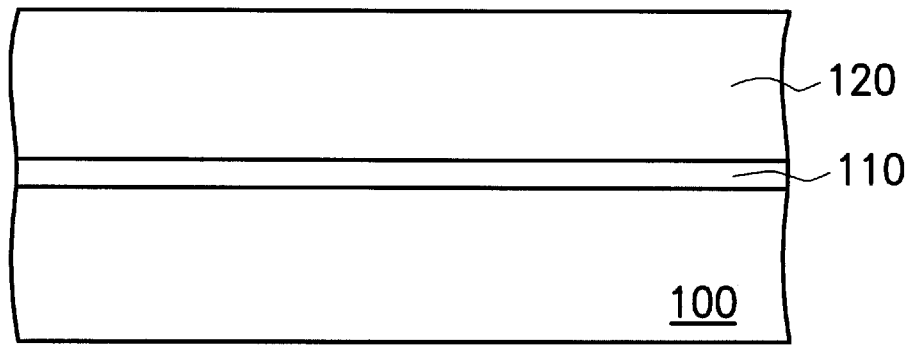
FIGS. 1A through 1F are schematic, cross-sectional views showing the progression of manufacturing steps in fabricating a mask ROM according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic, cross-sectional views showing the progression of manufacturing steps in fabricating a mask ROM according to one preferred embodiment of this invention.

First, as shown in FIG. 1A, a pad oxide layer 110 and a silicon nitride layer 120 are sequentially formed over a substrate 100. The pad oxide layer 110 can be formed using a thermal oxidation method at a temperature of about 900° C., for example. The silicon nitride layer 120 can be formed using $Si_2H_2Cl_2$ and $NH_3$ as reactive gases in a low-pressure chemical vapor deposition (LPCVD) method, for example. Silicon nitride is preferably deposited at a reacting temperature of between 700° to 800° C. and a pressure of between 0.1 to 1 torr.

A plurality of predetermined active regions (not shown) is on the surface of the substrate 100. Each active region contains area for forming a channel region (not shown) and two source/drain regions (not shown) besides the channel region.

Figure 1B:
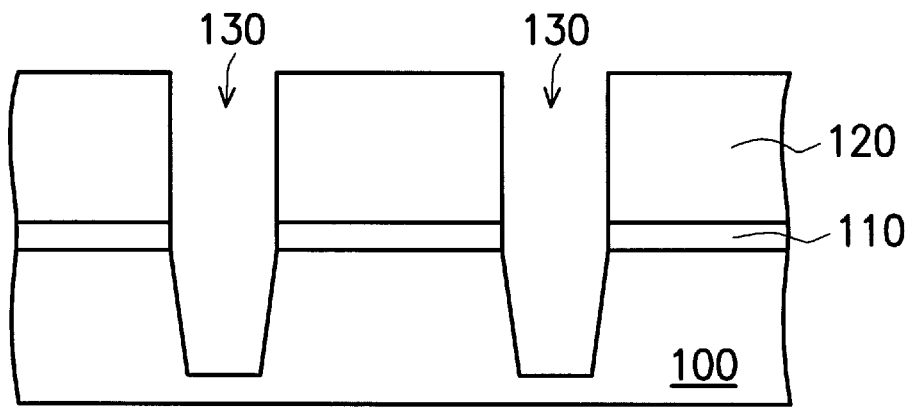

Next, as shown in FIG. 1B, using photolithographic and etching processes, a portion of the silicon nitride layer 120 and the pad oxide layer 110 in some of the channel regions are sequentially etched to form trenches 130. The silicon nitride layer 120 can be etched using $CH_3F$, $CHF_3$ and $NF_3$ plasma in a dry etching operation, for example. The pad oxide layer 110 can be etched using $CF_4$ plasma in a dry etching operation, for example.

Figure 1C:
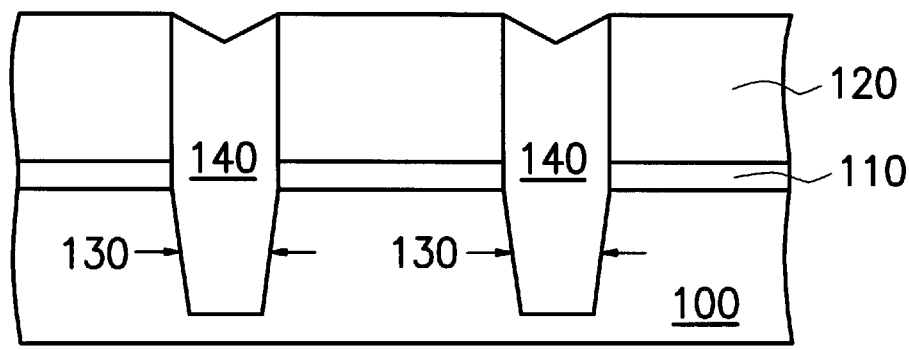

Next, as shown in FIG. 1C, silicon oxide is deposited into the trenches 130 and over the silicon nitride layer 120, and then the silicon oxide layer above the silicon nitride layer 120 is removed to form shallow trench oxide 140. The silicon oxide layer can be formed using tetraethyl orthosilicate (TEOS), $Si(OC_2H_5)_4$, as a reactive gas, a temperature of between 650° C. to 750° C. and a pressure of between 1 to 10 torr in a LPCVD method, for example. The layer of silicon oxide above the silicon nitride layer 120 can be removed using a chemical-mechanical polishing (CMP) method, for example.

Figure 1D:
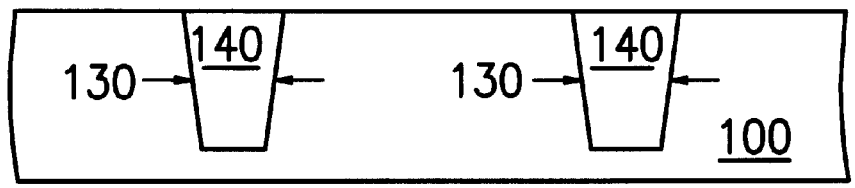

Next, as shown in FIG. 1D, the silicon nitride layer 120 and the pad oxide layer 110 are removed in sequence so that only the shallow trench oxides 140 remain in the substrate 100. The silicon nitride layer 120 can be removed by using hot phosphoric acid in a wet etching operation, and the pad oxide layer 110 can be removed using hydrofluoric acid solution, for example.

Figure 1E:
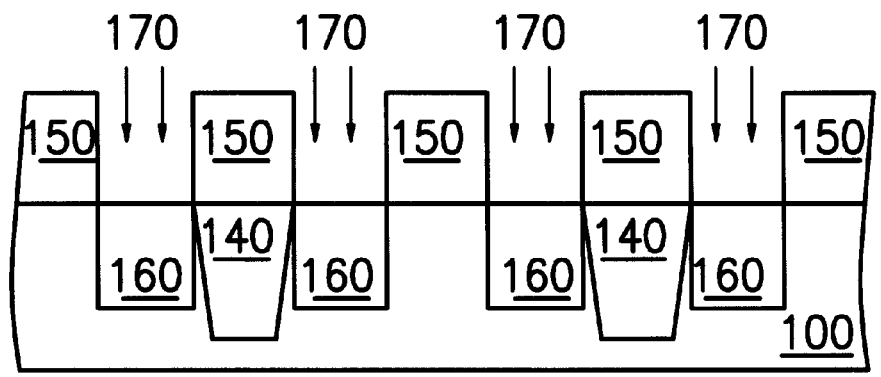

Next, as shown in FIG. 1E, a photoresist layer 150 is spin-coated over the substrate 100. After the photoresist layer 150 is exposed to light and developed, areas for forming source/drain terminals are exposed. Thereafter, an ion implant operation is carried out. Finally, source/drain terminals 160 or the bit lines of ROM are formed in the substrate 100.

Figure 1F:
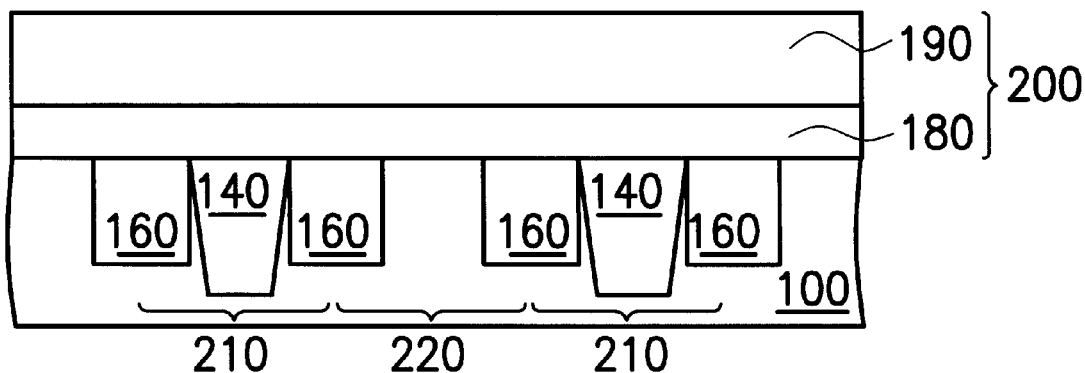

Next, as shown in FIG. 1F, a gate oxide layer and a polysilicon layer are sequentially formed over the substrate 100. Then, the gate oxide layer and the polysilicon layer are patterned to form gate structures 200 above the desired channel regions. A gate structure 200 comprises a gate oxide layer 180 and a polysilicon gate terminal 190. The polysilicon gate terminal 190 of the gate structure 200 constitutes the word line portion of the ROM. Therefore, the state of transistors 210 with shallow trench oxide in the channel regions is off, and the state of transistors 220 with no shallow trench oxide is on. The gate oxide layer is formed by performing a thermal oxidation at a temperature about 900° C., for example. The polysilicon layer is formed, for example, by using silane ($SiH_4$) as a reactive gas in a LPCVD operation. The polysilicon is preferably deposited at a temperature of between 600° C. to 650° C. and a pressure of between 0.3 to 0.6 torr.

In summary, the advantages of the invention include:

1. Shallow trench oxide is used instead of a field oxide layer, so the bird's beak problem is prevented. Hence, dimensions of transistor can be more easily controlled and the level of integration can be increased considerably.

2. A substrate having shallow trench oxide thereon has better degree of planarity than a substrate having field oxide layers.

3. A shallow trench oxide is formed in the channel region of those transistors intended to be shut off while no such structure is formed in the channel region of transistors intended to be in the conductive state. Consequently, the on-off state of a transistor is more definite and reliable than the method of implanting ions into the channel region of a transistor.

4. Since the on-off state of a transistor is already determined prior to its production, no additional photomask-making and ion implant operation are required to code the memory cells.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing mask ROM, comprising the steps of:

providing a substrate;

forming a plurality of first and second active regions in the substrate, each first and second active region having a channel region and two source/drain regions one on each side of the channel regions;

forming a plurality of shallow trench isolation structures filled with oxide in the channel regions of the first and the second active regions within the substrate simultaneously;

forming a plurality of source/drain terminals in the source/drain regions after forming the shallow trench isolation structures; and forming a plurality of gate terminals above the channel regions.

2. The method of claim 1, wherein the step of forming the shallow trench oxide includes the substeps of:

forming a pad oxide layer over the substrate;

forming a silicon nitride layer over the pad oxide layer;

patterning the silicon nitride layer and the pad oxide layer in sequence;

etching the substrate to form a plurality of shallow trenches using the silicon nitride layer as an etching mask;

depositing silicon oxide into the shallow trenches and over the substrate;

polishing away the silicon oxide layer above the silicon nitride layer in a chemical-mechanical polishing operation while using the silicon nitride layer as a polishing stop layer; and removing the silicon nitride layer and the pad oxide layer in sequence so that a plurality of shallow trench oxide remain in the substrate.

3. The method of claim 1, wherein the step of forming the bit lines includes implanting ions into the substrate.

4. The method of claim 1, wherein the step of forming the word line includes the substeps of:

performing a thermal oxidation to form a gate oxide layer over the substrate;

depositing a layer of polysilicon over the gate oxide layer using a chemical vapor deposition method; and carrying out photolithographic and etching operations to pattern out the word lines.

5. A method of manufacturing a mask read-only-memory, comprising the steps of:

providing a substrate;

forming a plurality of shallow trench isolations in the substrate at which a plurality of first channel regions are formed;

forming a plurality of source/drain regions at both sides of the shallow trench isolation such that a plurality of second channel regions are formed in the substrate between two neighboring source/drain regions which is free of the shallow trench isolation;

forming a gate on the source/drain regions, the first and the second channel regions, wherein the gate is in direct contact with the source/drain regions.

* * * * *